United States Patent [19]
Wilkinson et al.

[11] Patent Number: 5,384,869
[45] Date of Patent: Jan. 24, 1995

[54] IMAGE PROCESSING APPARATUS

[75] Inventors: James H. Wilkinson, Tadley; Michael J. Ludgate; Jonathan M. Soloff, both of Basingstoke; Jonathan J. Stone, Reading, all of United Kingdom

[73] Assignee: Sony United Kingdom Limited, Staines

[21] Appl. No.: 957,159

[22] Filed: Oct. 7, 1992

[30] Foreign Application Priority Data

Dec. 24, 1991 [GB] United Kingdom ................. 9127352

[51] Int. Cl.⁶ .............................................. G06K 9/36
[52] U.S. Cl. ..................................... 382/56; 348/384; 348/398; 348/424
[58] Field of Search ..................... 382/56, 27; 358/133, 358/136; 348/398, 384, 390, 424, 425; 364/724.1, 724.17

[56] References Cited

U.S. PATENT DOCUMENTS

| | | | |
|---|---|---|---|
| 4,829,378 | 5/1989 | LeGall | 382/43 |
| 5,097,331 | 3/1992 | Chen | 358/138 |
| 5,220,422 | 6/1993 | Oh | 358/133 |
| 5,223,926 | 6/1993 | Stone | 358/133 |

OTHER PUBLICATIONS

LeGall: "Sub-Band Coding of Digital Images Using Symmetric Short Kernal Filters . . . " IEEE, 1988 p. 761.
Fan: "Compatibility in Subband HDTV Coding", Apr. 1992 p. 405.
Pestel: "Design of HDTV Subband Filterbanks Considering VLSI Implementation Constraints." IEEE Trans Circuits and Sys for Video Tech. vol. 1 No. 1 Mar. 91.
Bamberger: "A Multirate Filter Bank Pre–Processor for Image Compression." IEEE, 1989, p. 890.
Simon: "A General Sub–Band Coding Scheme for 140 MBits/s HDTV". Apr. 1992 p. 401.
Ebrahimi: "Application of an Optimally Localized and Fast Wavelet Transform in Image Compression" IEEE, 1992 p. 57.
Pirsch: "VLSI Architectures of Two–Dimensional Filters for HDTV Coding," IEEE, 1992 p. 1648.
Chen: "Subband Coding for ATV Signals Based on Spatial Domain Considerations". SPIE 1989.

Primary Examiner—David K. Moore
Attorney, Agent, or Firm—William S. Frommer; Alvin Sinderbrand

[57] ABSTRACT

Image processing apparatus is described for filtering a digital representation of a raster scanned image into a plurality of sub-bands in the two-dimensional spatial frequency domain, the resolution of the raster scanned image in a first direction (usually the horizontal direction) being greater than the resolution of the raster scanned image in a second direction (usually the vertical direction). The image processing apparatus has a decimation filter means comprising a number of multitap digital decimation filters for spatial filtering in the first and second directions. The mean of the filter lengths of the filters used for filtering in the first direction is greater than that of the filters used for filtering in the second direction. Complementary interpolation apparatus for reconstructing the image from the plurality of sub-bands is also described.

27 Claims, 14 Drawing Sheets

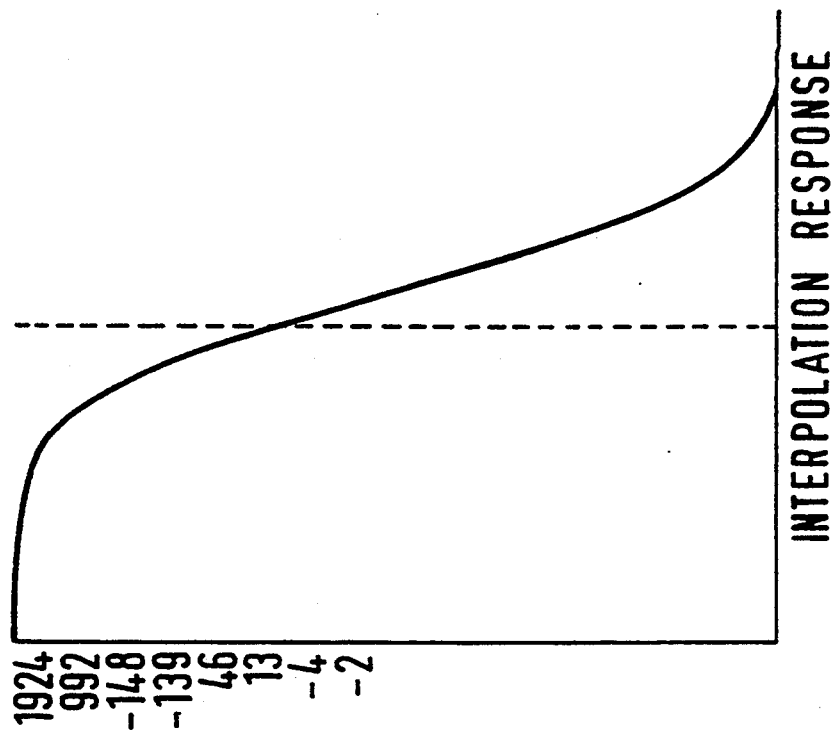
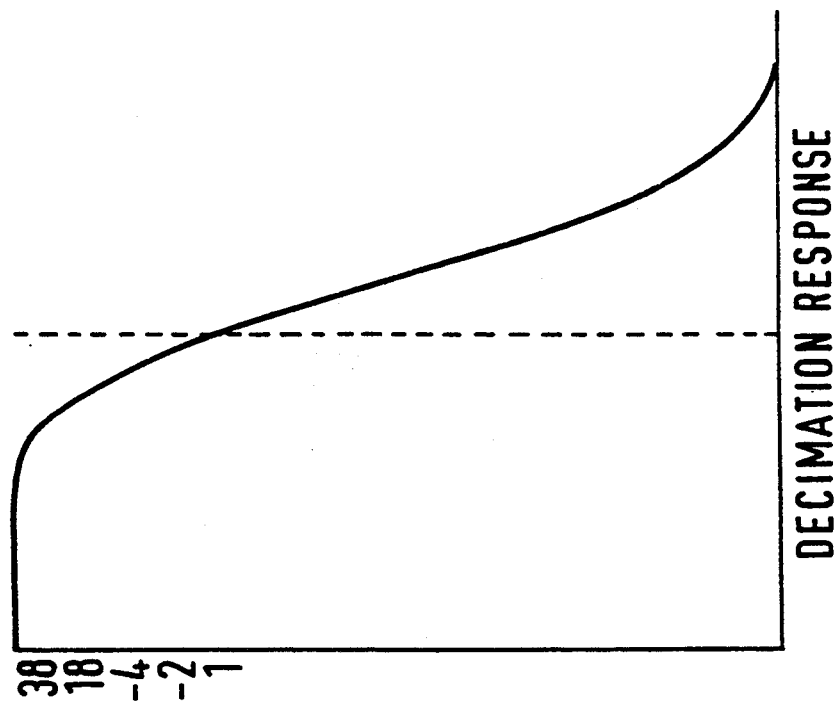

INTERPOLATION RESPONSE

DECIMATION RESPONSE

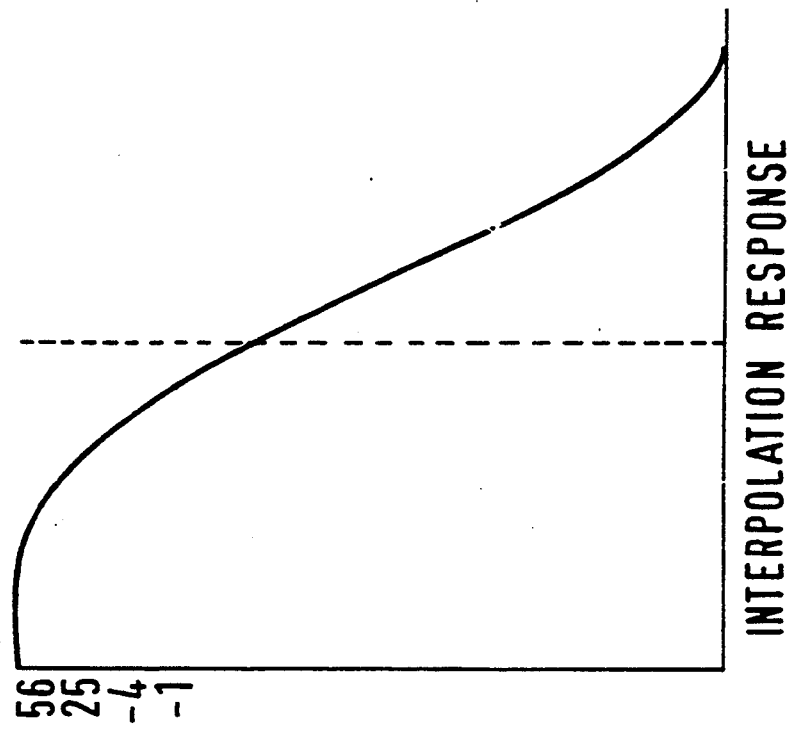
FIG.IIB
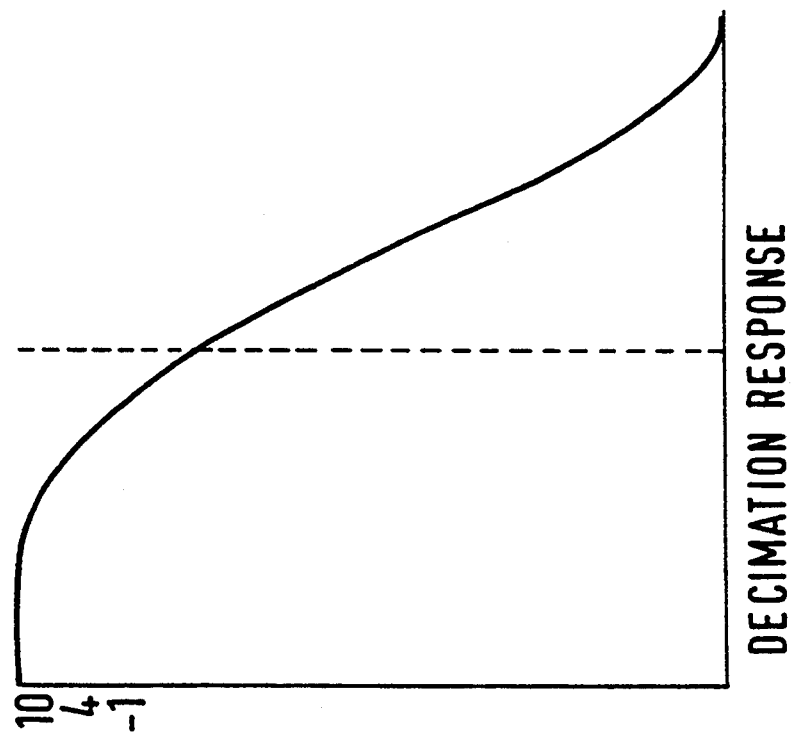
FIG.IIA

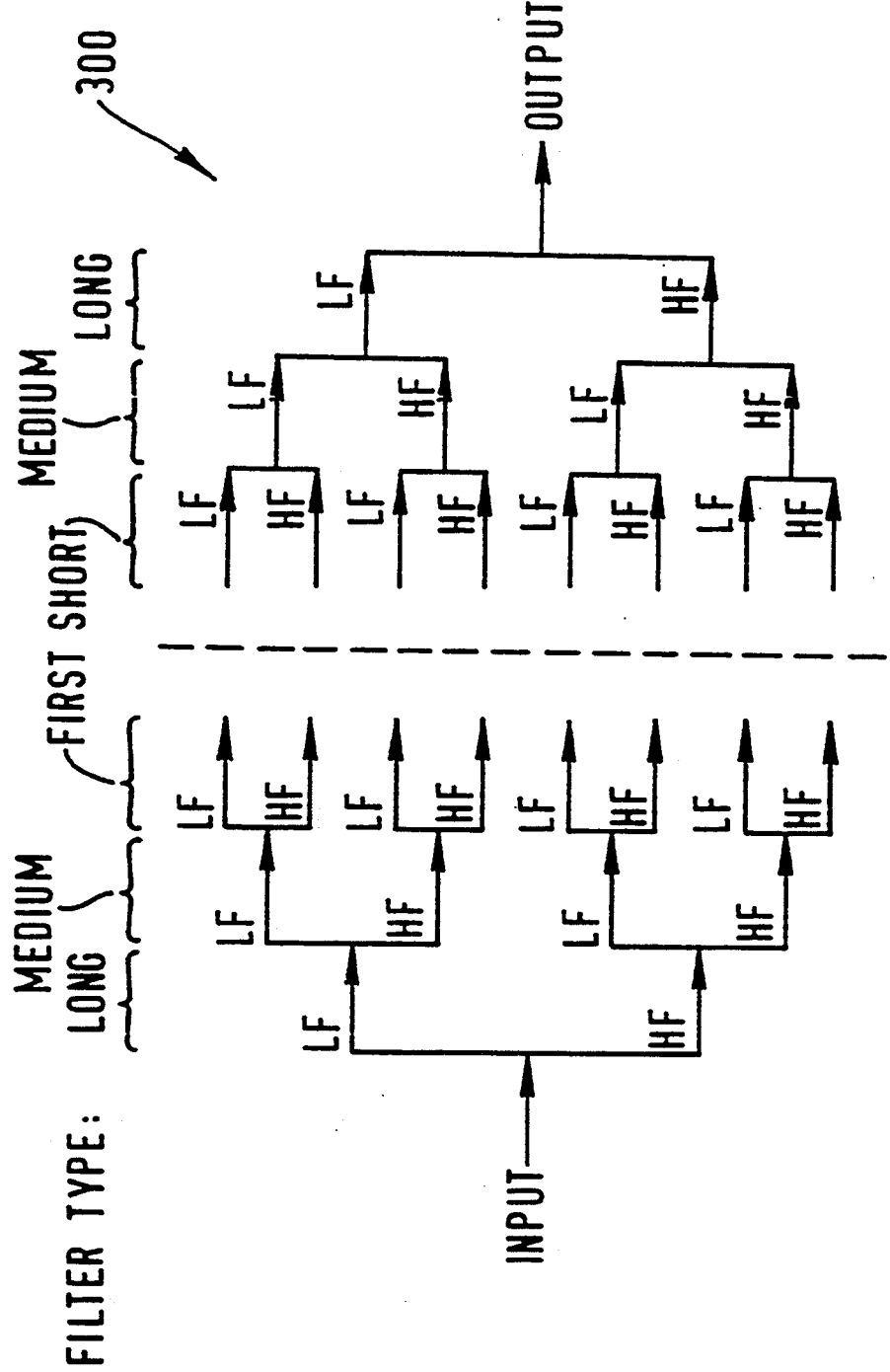
FIG.14(a) HORIZONTAL LUMINANCE FILTER ARRANGEMENT

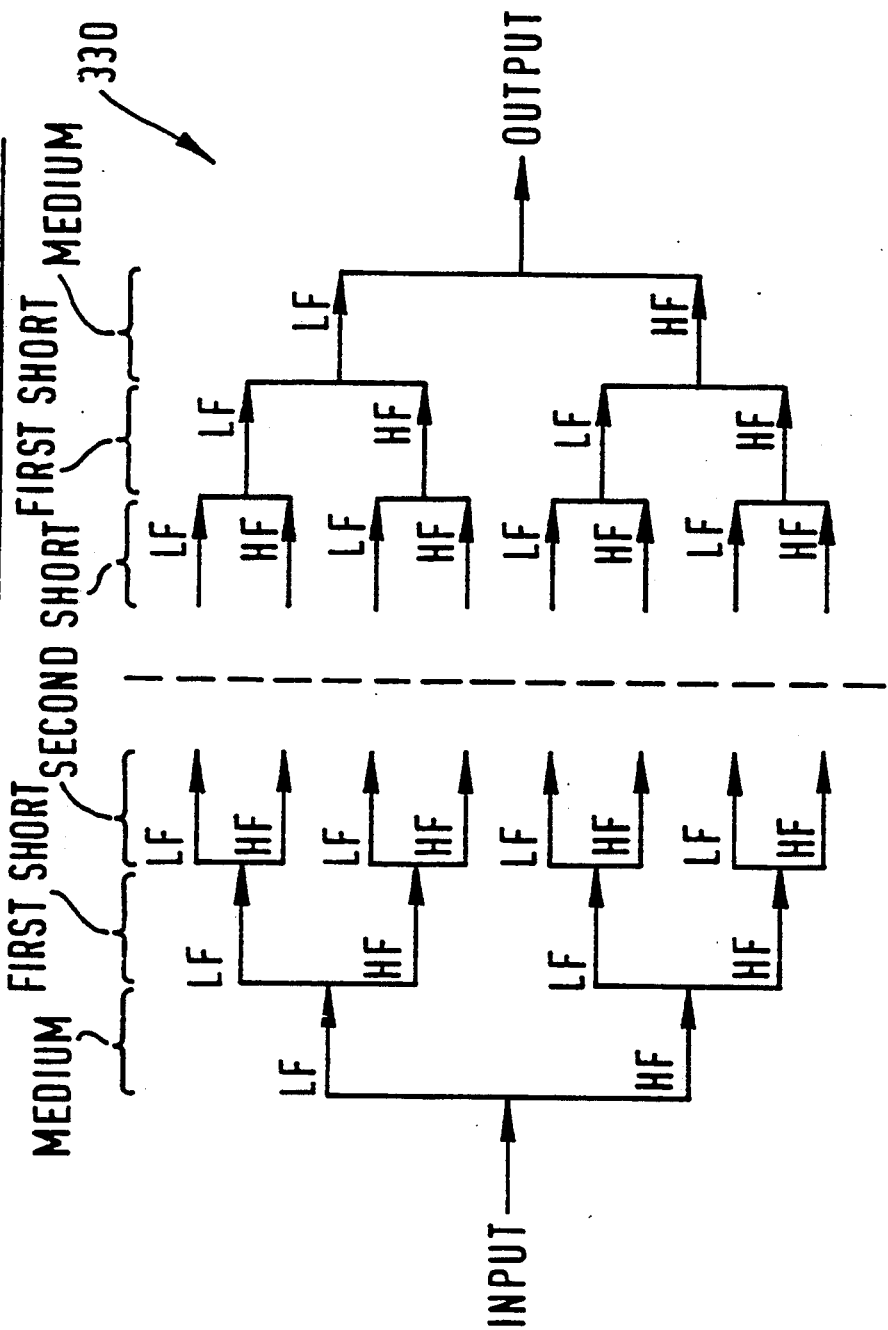
FIG. 14(b) VERTICAL LUMINANCE FILTER ARRANGEMENT

IMAGE PROCESSING APPARATUS

BACKGROUND OF THE INVENTION

1. Field of the Invention

This invention relates to image processing apparatus, particularly of the type in which a digital representation of an image is filtered into a plurality of sub-bands in the two-dimensional spatial frequency domain.

2. Description of the Prior Art

It is known to use multi-tap digital finite impulse response (FIR) filters in the field of image processing. The filters operate on successive data elements representing respective digital samples of a scanned image. An element at the output of the filter represents a weighted sum of a predetermined number of equispaced elements or samples in the unfiltered data. The frequency response of the filter can be determined in advance by selecting a suitable number of elements to be included in the sum (that is, a suitable tap length) and by deriving appropriate weighting values or filter coefficients using known mathematical techniques.

A recently proposed use of these filtering techniques is to filter a digital representation of an image into a number of sub-bands in the two-dimensional spatial frequency domain. In this approach a spatial (two-dimensional) sub-band filtering arrangement divides an input video signal into a plurality of uncorrelated sub-bands each containing the spatial frequency content of the image in a respective one of a plurality of areas of a two dimensional frequency plane. The separate sub-bands may then be processed separately for the purposes of transmission or storage. At the reconstruction stage the sub-bands are interpolated and filtered before being added together to reproduce the original image, or at least an approximation of it. To achieve satisfactory results it is important that the filters used for interpolation are mathematically complementary to the decimation filters. The sub-band filtering approach has a number of useful features, particularly relating to the ease with which the resulting filtered data can be compressed for transmission or storage.

A data compression system incorporating sub-band filtering can make use of the fact that in the two-dimensional spatial frequency domain, low spatial frequency components of a picture are much more important to the perceived quality of a reconstructed picture than are components at high spatial frequency. To achieve data compression it has been proposed to encode the high spatial frequency sub-bands to a lower precision than those corresponding to low spatial frequency.

SUMMARY OF THE INVENTION

It is an object of the invention to improve the performance of image processing techniques so as to reduce any subjective deterioration of the final image caused by the processing.

Viewed from a first aspect this invention provides image processing apparatus for filtering a digital representation of a raster scanned image into a plurality of sub-bands in the two-dimensional spatial frequency domain, said raster scanned image having a resolution in a first direction and a resolution in a second direction, said resolution of said raster scanned image in said first direction being greater than said resolution of said raster scanned image in said second direction, said image processing apparatus having:

a decimation filter means comprising a first plurality of multi-tap digital decimation filters, each having a filter length, for filtering in said first direction and a second plurality of multi-tap digital decimation filters, each having a filter length, for filtering in said second direction, wherein a mean of said filter lengths of said first plurality of multi-tap digital decimation filters is greater than a mean of said filter lengths of said second plurality of multi-tap digital decimation filters.

The invention recognises that the visible effects of, for example, data rate reduction applied to two-dimensional FIR sub-band filtering on the reconstructed picture vary according to the filter lengths of the decimation and interpolation filters, and the spatial resolution of the image to be filtered. The invention exploits these variations in effects by using filters having tap lengths which depend on the spatial resolution of the image in the direction of filtering.

If a long filter length (a large number of taps) is used then the filter can be made to have a sharp frequency roll-off. This will help to prevent alias distortions in which unwanted frequency components from the frequency range corresponding to one sub-band are included in another sub-band. However, if the sub-band data used by the interpolation filters to reconstruct a picture contain data errors in the spatial frequency domain, the filters can introduce a ringing distortion which increases with the filter length.

The converse situation is that while a short filter length will give a better response to errors at the interpolation stage, it can also lead to increased distortions introduced because of alias components affecting adjacent sub-bands. It can also lead to a loss of entropy encoding efficiency.

In accordance with the invention the different distortions introduced by longer and shorter filters are matched to the spatial properties of the image to be filtered. In the reconstructed image the pixels are closer together in the first direction (the direction of higher resolution) than in the second direction (the direction of lower resolution). A longer filter length can therefore be used in the first direction because any ringing distortion will be confined to a smaller area on the reconstructed image than the image area which would be occupied by an equal amount of ringing in the second direction. The use of the longer filter length in the first direction provides a reduction in alias distortion in that direction. A shorter filter length is used in the second direction to reduce the visibility of ringing distortion in this direction, although this will be at the expense of higher alias distortion and lower entropy coding efficiency.

One preferred configuration is to that in which all of the filters in the first plurality of multi-tap digital decimation filters have the same filter length and that all of the filters in the second plurality of multi-tap digital filters have the same filter length. Another preferred configuration is that in which at least one of the first and second pluralities of multi-tap digital decimation filters comprises a first and a second filter stage, the decimated output of the first filter stage being passed as an input to the second filter stage, each filter stage comprising one or more of the respective plurality of multi-tap digital decimation filters, the filter length of the one or more filters in the first stage being greater than the filter length of the one or more filters in the second stage. This latter configuration allows the filter lengths to be varied as the effective resolution of the image is reduced by each decimation stage.

The invention is particularly applicable to a conventional raster scanned image in which the first direction is substantially the direction of line scanning of the image and the second direction is substantially perpendicular to the first direction. If such an image is in interlaced form then usually there will already be a degree of aliasing in the second direction, so the additional aliasing introduced by the use of a shorter filter length in the second direction may not affect the quality of the reconstructed picture by a noticeable degree.

Although a composite video signal could be processed, it is preferred that the luminance and chrominance components of the image are processed separately, by means of first and second decimation filter means for respective filtering of luminance and chrominance components of the image, each of the first and second decimation filter means comprising a first plurality of multi-tap digital decimation filters for filtering in the first direction and a second plurality of multi-tap digital decimation filters for filtering in the second direction. In such an embodiment it is preferred that the mean of the filter lengths of the first plurality of multi-tap digital decimation filters in the first decimation filter means is greater than the mean of the filter lengths of the first plurality of multi-tap digital decimation filters in the second decimation filter means, and that the mean of the filter lengths of the second plurality of multi-tap digital decimation filters in the first decimation filter means is greater than the mean of the filter lengths of the second plurality of multi-tap digital decimation filters in the second decimation filter means.

Although decimation and interpolation could be performed by separate image processing apparatus, in a preferred embodiment the image processing apparatus further comprises an interpolation filter means having a first plurality of multi-tap digital interpolation filters, complementary to the first plurality of multi-tap digital decimation filters, for filtering in the first direction and a second plurality of multi-tap digital interpolation filters, complementary to the second plurality of multi-tap digital decimation filters, for filtering in the second direction, wherein the mean of the filter lengths of the first plurality of multi-tap digital interpolation filters is greater than the mean of the filter lengths of the second plurality of multi-tap digital interpolation filters.

Viewed from a second aspect this invention provides image processing apparatus in which a digital representation of a raster scanned image is interpolated from a plurality of sub-bands in the two-dimensional spatial frequency domain, said raster scanned image having a resolution in a first direction and a resolution in a second direction, said resolution of said raster scanned image in said first direction being greater than said resolution of said raster scanned image in said second direction, said image processing apparatus having:

an interpolation filter means comprising a first plurality of multi-tap digital interpolation filters, each having a filter length, for filtering in said first direction and a second plurality of multi-tap digital interpolation filters, each having a filter length, for filtering in said second direction, wherein a mean of said filter lengths of said first plurality of multi-tap digital interpolation filters is greater than a mean of said filter lengths of said second plurality of multi-tap digital interpolation filters.

One preferred configuration of the apparatus is that in which all of the filters in the first plurality of multi-tap digital interpolation filters have the same filter length, and all of the filters in the second plurality of multi-tap digital interpolation filters have the same filter length. A further preferred configuration is that in which at least one of the first and second pluralities of multi-tap digital interpolation filters comprises a first and a second filter stage, the interpolated output of the first filter stage being passed as an input to the second filter stage, each filter stage comprising one or more of the respective plurality of multi-tap digital interpolation filters, the filter length of the one or more filters in the second stage being greater than the filter length of the one or more filters in the first stage. As in the case of the decimation filtering, this latter configuration allows the filter length to increase as the effective resolution of the image increases at each stage of interpolation.

As above, this second aspect of the invention is particularly applicable to image data in which the first direction is substantially the direction of line scanning of the image, and the second direction is substantially perpendicular to the first direction.

Preferably the image processing apparatus has first and second interpolation filter means for respective filtering of luminance and chrominance components of the image, each of the first and second interpolation filter means comprising a first plurality of multi-tap digital interpolation filters for filtering in the first direction and a second plurality of multi-tap digital interpolation filters for filtering in the second direction. In this case it is preferred that the mean of the filter lengths of the first plurality of multi-tap digital interpolation filters in the first interpolation filter means is greater than the mean of the filter lengths of the first plurality of multi-tap digital interpolation filters in the second interpolation filter means, and that the mean of the filter lengths of the second plurality of multi-tap digital interpolation filters in the first interpolation filter means is greater than the mean of the filter lengths of the second plurality of multi-tap digital interpolation filters in the second interpolation filter means.

Image processing apparatus according to the first or second aspects of the invention is particularly useful when included in image data compression apparatus, image data decompression apparatus or image data storage apparatus.

A number of preferred sets of relative filter coefficients are listed in the appended sub-claims.

Viewed from a third aspect this invention provides a method of filtering a digital representation of a raster scanned image into a plurality of sub-bands in the two-dimensional spatial frequency domain, said raster scanned image having a resolution in a first direction and a resolution in a second direction, said resolution of said raster scanned image in said first direction being greater than said resolution of said raster scanned image in said second direction, said method comprising the steps of:

(I) filtering in said first direction with a first plurality of multi-tap digital decimation filters, each having a filter length; and (II) filtering in said second direction with a second plurality of multi-tap digital decimation filters, each having a filter length; wherein a mean of said filter lengths of said first plurality of multi-tap digital decimation filters is greater than a mean of the filter lengths of said second plurality of multi-tap digital decimation filters.

Viewed from a fourth aspect this invention provides a method of interpolating a digital representation of a raster scanned image from a plurality of sub-bands in the two-dimensional spatial frequency domain, said raster scanned image having a resolution in a first direction and a resolution in a second direction, said resolution of said raster scanned image in said first direction being greater than said resolution of the raster scanned image in said second direction, said method comprising the steps of:

(I) filtering in said first direction with a first plurality of multi-tap digital interpolation filters, each having a filter length; and (II) filtering in said second direction with a second plurality of multi-tap digital interpolation filters, each having a filter length; wherein a mean of said filter lengths of said first plurality of multi-tap digital interpolation filters is greater than a mean of said filter lengths of said second plurality of multi-tap digital interpolation filters.

The above, and other objects, features and advantages of this invention will be apparent from the following detailed description of illustrative embodiments which is to be read in connection with the accompanying drawings.

BRIEF DESCRIPTION OF THE DRAWINGS

FIGS. 8 to 11 show coefficients and corresponding frequency responses for four example decimation/interpolation filter pairs for use in a sub-band decorrelator;

FIGS. 14(a) and (b) illustrate a configuration of the coding system shown in FIG. 2, in which filters having different tap lengths are used for different stages of decimation and interpolation.

DESCRIPTION OF THE PREFERRED EMBODIMENTS

Figure 1:
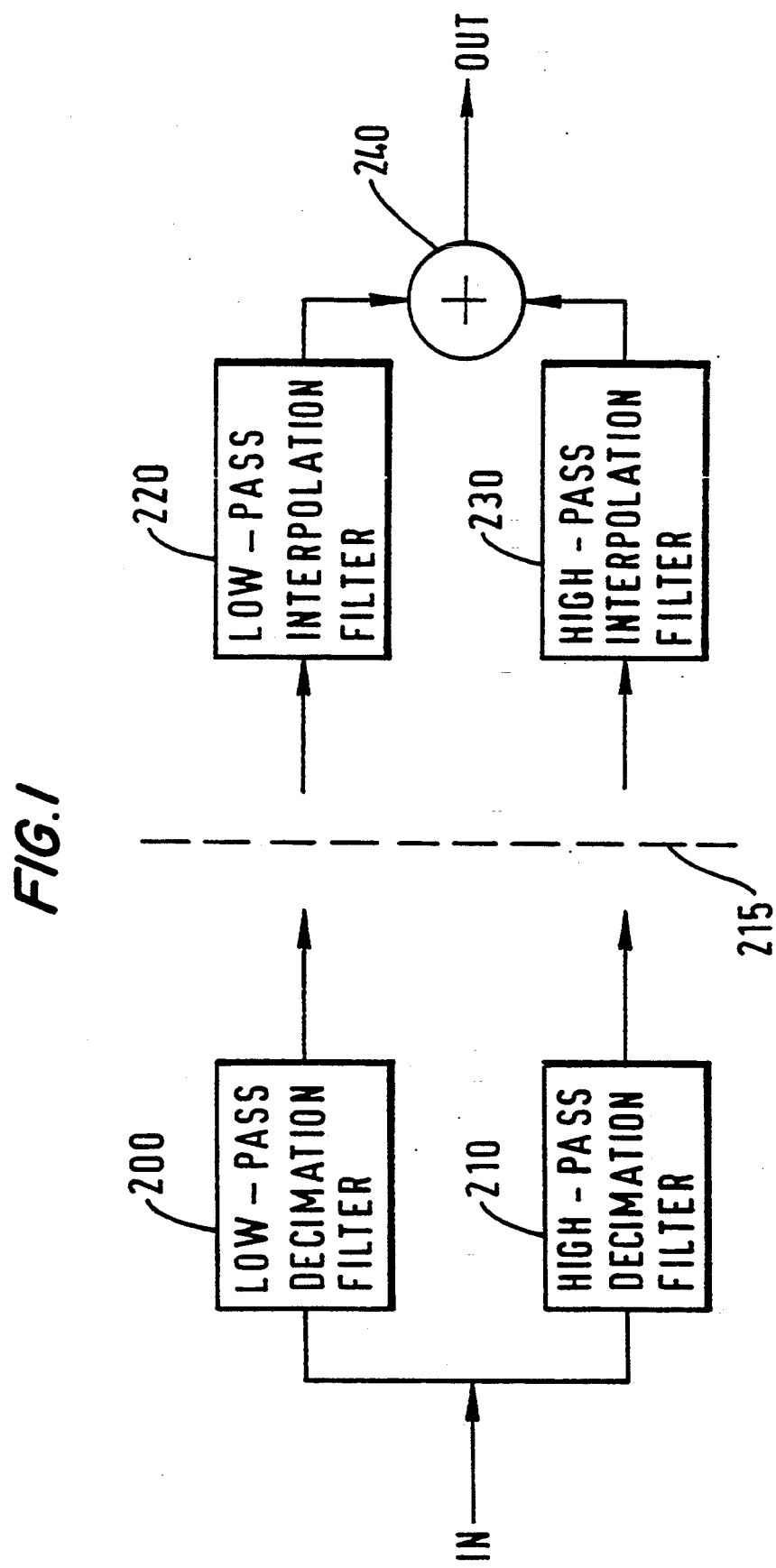
FIG. 1 is a schematic illustration of one stage of sub-band coding.

Referring now to FIG. 1, one stage of sub-band coding is illustrated in which an input video signal is passed through a low pass decimation filter 200 and a high pass decimation filter 210. The resulting two output signals represent different portions of the frequency spectrum of the input signal, and can now be transmitted or stored. The storage of transmission of the sub-band components is illustrated by the dashed line 215 in FIG. 1.

When the sub-band components are received or recovered from the storage medium they ape passed through corresponding matching filters to regenerate the original frequency components. These matching filters are a low pass interpolation filter 220 and a high pass interpolation filter 230. The outputs of the interpolation filters 220, 230 are added by a summation circuit 240 to yield the original video input signal.

Figure 2:
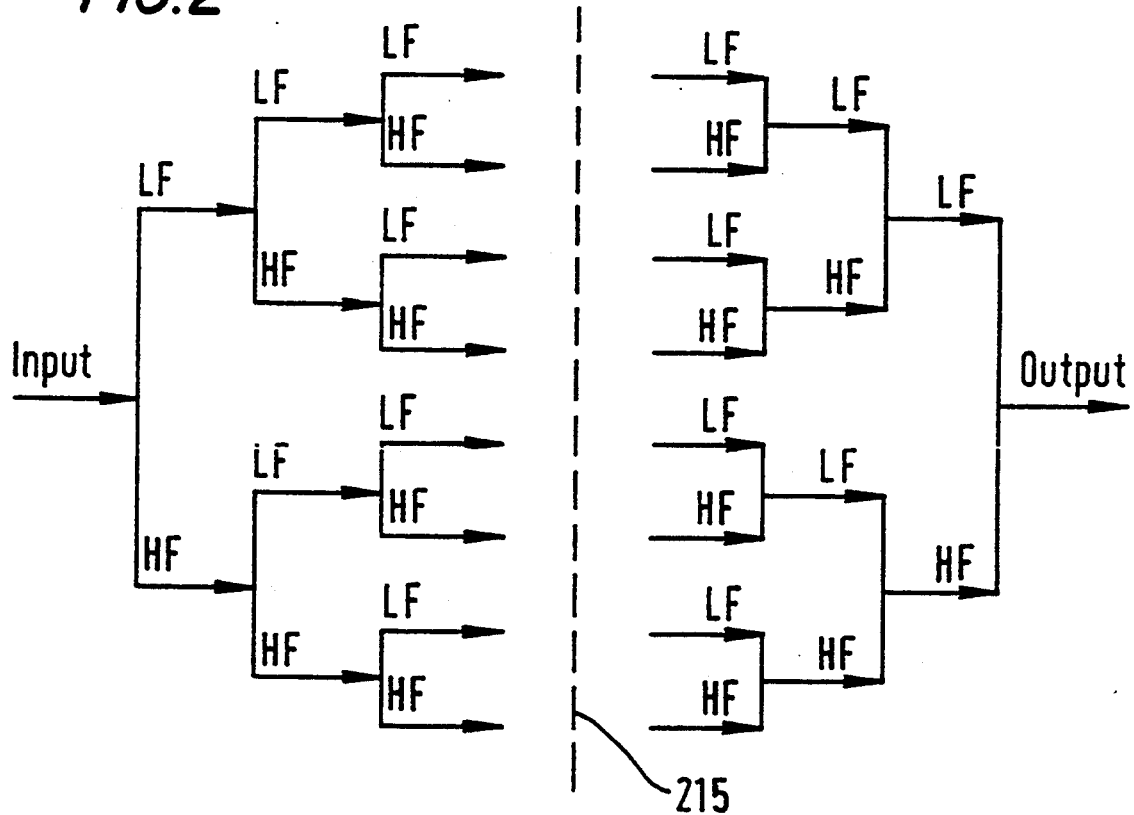
FIG. 2 is a schematic illustration of a higher order sub-band coding system.

FIG. 1 illustrates the decomposition of an input video signal into two sub-bands. However, in practice, the input video signal would be decomposed into many more sub-band components. FIG. 2 illustrates the decomposition of an input video signal into eight sub-band components and its subsequent recombination into an output video signal.

The filters of the sub-band coding system comprise finite impulse response filters with appropriate delays and weighting coefficients to perform both horizontal and vertical frequency decomposition. The filters used in the present embodiment will be described in more detail below.

Figure 3:
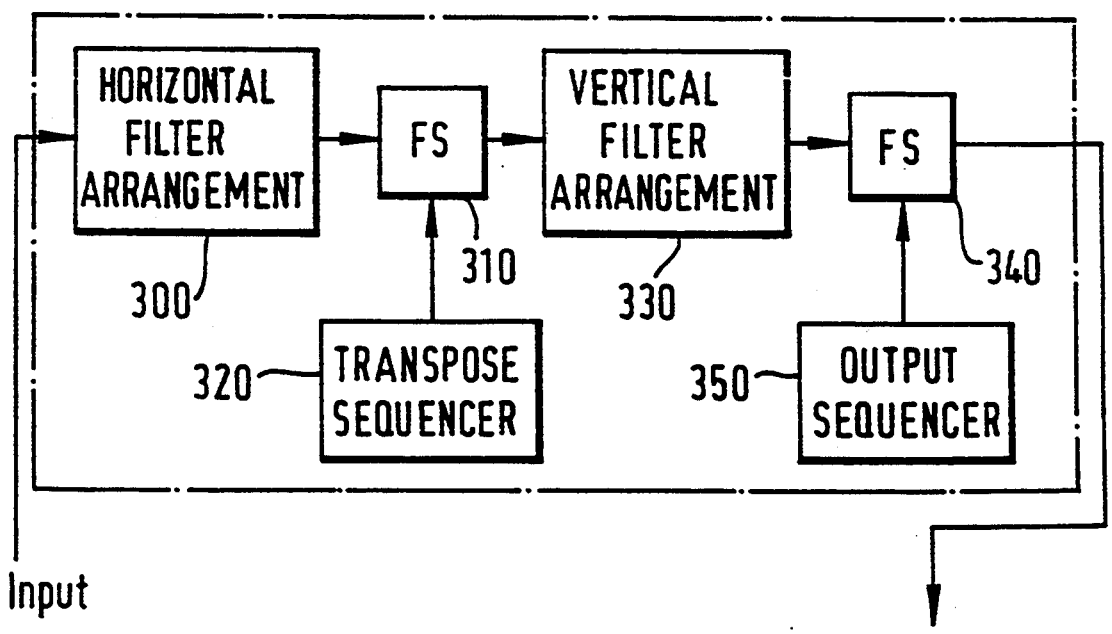
FIG. 3 illustrates a two-dimensional sub-band decorrelator.

FIG. 3 illustrates a two-dimensional decorrelator comprising a horizontal filter arrangement 300, an intermediate field store 310, a transpose sequencer (address generator) 320, a vertical filter arrangement 330, an output field store 340 and an output sequencer (address generator) 350. Sub-band filtering is effected on a separable basis. Thus, in FIG. 3, filtering operations in the two orthogonal image directions, namely the horizontal direction (the direction of image scanning in the case of conventional video) and the vertical direction, are effected entirely independently and separately of one another by respective one-dimensional filtering operations performed in the horizontal and vertical filter arrangements 300 and 330 respectively.

The horizontal filter arrangement 300 and the vertical filter arrangement 330 can be of substantially the same overall structure as one another, although the individual filters used in the arrangements are different. Thus, the construction of the horizontal filter arrangement 300 only will be described in detail. The filtering is to achieve 8 sub-bands in each of the horizontal and vertical directions, i.e. a square array of 64 (8×8) sub-bands is produced. The 64 sub-bands are to be of equal extent to one another.

The horizontal filter arrangement 300 is preferably of a tree or hierarchical structure as shown in FIG. 2, comprising three successive filter stages. The first stage comprises a low pass filter (LF) and a high pass filter (HF), each of which is followed by a respective decimator (not shown). The LF filter, HF filter and the decimators together make up a quadrature mirror filter (QMF). In practice, the QMF may comprise a single switched FIR filter such as that described below with reference to FIG. 6. However, in connection with FIGS. 2 and 3 the filtering and decimation operations will be described as being separate phases in the filtering process.

Each of the filters can be a finite impulse response filter as described below. In use, a line of a field of the input digital video signal is applied, sample-by-sample, to the first stage, to be low pass filtered and high pass filtered by the LF and HF respectively. Thus, the LF and HF produce outputs comprising low pass filtered and high pass filtered versions of the input line, respectively, the outputs representing the spatial frequency content of the line in the lower and upper halves of the horizontal spatial frequency range. That is, the first stage divides the input line into two sub-bands in the horizontal direction. The decimators decimate (sub-sample) the respective outputs by a factor of two, whereby the total number of samples outputted by the decimators (together) is the same as the total number of samples in the line.

The second stage is of similar construction to the first stage, except that there are two QMFs each as in the first stage and the output from each of the decimators of the first stage is passed as an input to a respective one of the two QMFs. Thus, the second stage produces four outputs representing the spatial frequency content of the line in four equal quarters of the horizontal spatial frequency range. That is, the second stage further divides the two sub-bands, into which the input line was divided in the first stage, into four sub-bands in the horizontal direction. The four decimators of the second stage decimate (sub-sample) the respective outputs by a factor of two, whereby the total number of samples outputted by the decimators of the second stage (together) is the same as the total number of samples in the line.

The third stage is of similar construction to the first stage, except that there are four QMFs each as in the first stage and the output from each of the four decimators of the second stage is passed as an input to a respective one of the four QMFs. Thus, the third stage produces eight outputs representing the spatial frequency content of the line in eight equal one-eighths of the horizontal spatial frequency range. That is, the third stage divides the four sub-bands into which the line was previously divided into the required eight sub-bands in the horizontal direction. The eight decimators of the third stage decimate (sub-sample) the respective outputs by a factor of two, whereby the total number of samples outputted by the decimators of the third stage (together) is the same as the total number of samples in the line.

The eight outputs of the third stage, that is of the horizontal filter arrangement 300, are passed to the intermediate field store 310 and stored at positions corresponding to respective one-eighths of a first line thereof. The above process of horizontal filtering is then repeated for all of the other lines of the field of the input digital video signal. This results in the intermediate field store 310 containing a version of the field of the input digital video signal that has been filtered into eight sub-bands in the horizontal direction (only). Each line of the field stored in the intermediate field store 310 is divided into eight portions each containing the horizontal spatial frequency information in a respective one of eight sub-bands of the horizontal spatial frequency range of the image that the original field represented. Thus, the horizontally filtered field stored in the intermediate field store 310 can be considered to divided into eight columns.

The horizontally filtered field stored in the intermediate field store 310 is then fed (under the control of the transpose sequencer 320) into the vertical filter arrangement 330, in which it is filtered into eight sub-bands in the vertical direction in similar manner to that in which filtering into eight sub-bands in the horizontal direction was achieved in the horizontal filter arrangement 300. The horizontally and vertically filtered field is fed on a line-by-line basis into the output field store 340 to be passed from there for further processing. The output field store 340 can be considered to have been partitioned into an array of 64 (8Γ8) storage regions, in each of which a respective one of the 64 sub-bands is stored.

The transpose sequencer 320 produces read addresses for the intermediate field store 310, to control reading of the contents thereof into the vertical filter arrangement 330, as follows. As will be recalled, the signal as stored in the intermediate field store 310 comprises the lines of the original field, each divided horizontally into eight sub-bands. That is, the signal as stored in the intermediate field store 310 can, as mentioned above, be considered to comprise eight columns. To enable the signal stored in the intermediate field store 310 to be vertically filtered by hardware of the same construction (the vertical filter arrangement 330) used to horizontally filter it, it must be transposed, that is rotated through 90 degrees, as it is read to the vertical filter arrangement 330, so that it comprises eight rows (as opposed to columns). The transpose sequencer 320 addresses the intermediate field store 310 in such a manner as to accomplish this.

The nature of the filtering produced by the combination of the horizontal filter arrangement 300 and the vertical filter arrangement 330 is such that data stored in the output field store 340 is somewhat scrambled and must be re-ordered by the output sequencer 350 before being passed for further processing.

Figure 4:
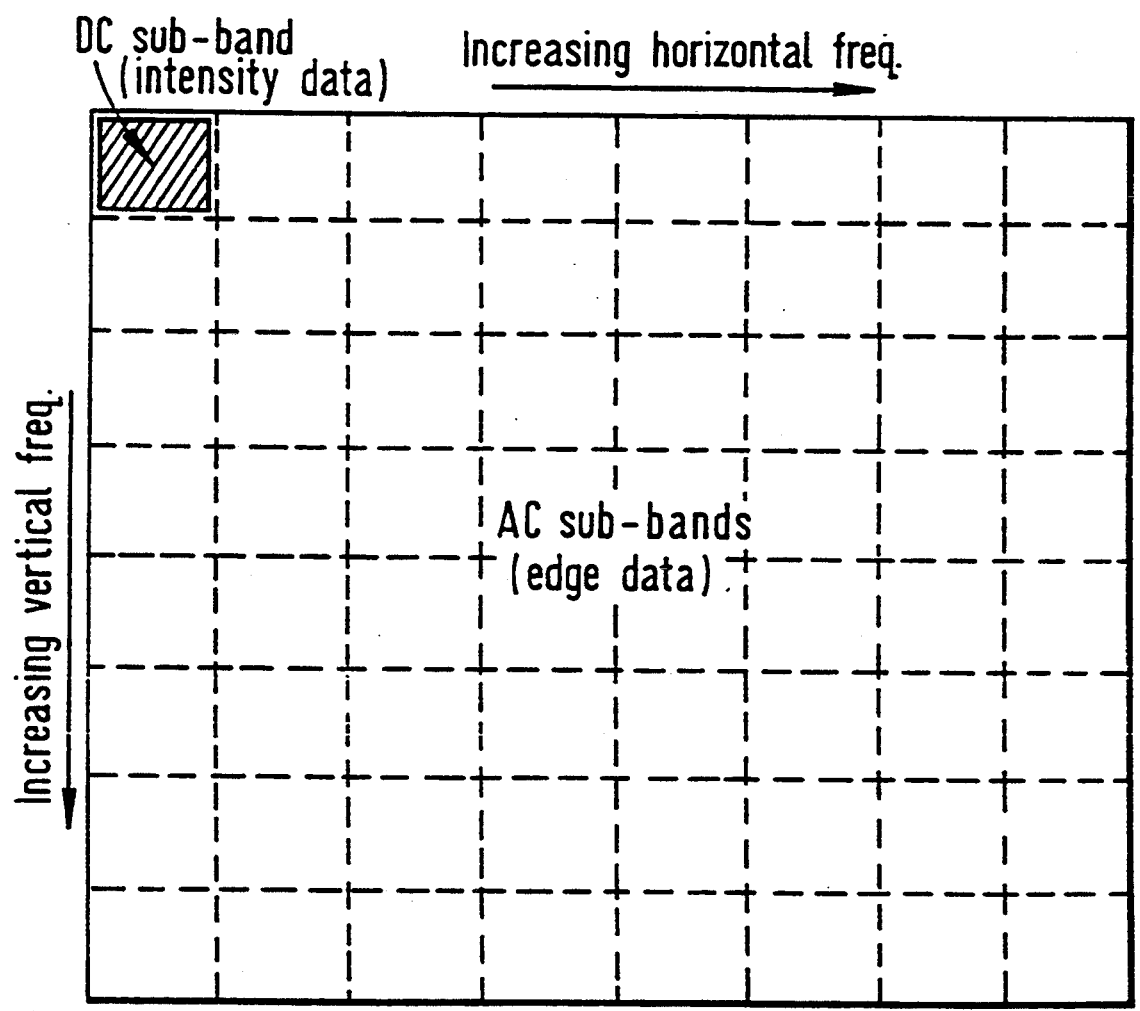
FIG. 4 illustrates a frequency separated video signal.

FIG. 4 illustrates the various sub-band components produced if the input video signal is decomposed both horizontally and vertically into eight frequency components (this can be considered to be the data stored in the output field store 340 after it has had the reordering of the output sequencer 350 applied to it). Each of the sub-bands or sub-pictures is represented by one of the blocks in FIG. 4. The upper left hand block represents the dc sub-band. This is the sub-band of lowest horizontal and vertical frequency although in practice it does not necessarily represent only the constant portions of the signal with strictly zero frequency. This dc sub-band will contain the majority of the dc luminance information of the original video signal. The relative importance of the remaining sub-bands to the eventual perception of the picture by a viewer varies. Generally speaking, the higher frequency sub-bands are less important to the eventual perception of a viewer. In relation to FIG. 4, the frequency which a particular sub-band represents increases in moving downwards and/or rightwards in the array of blocks.

Figure 5:
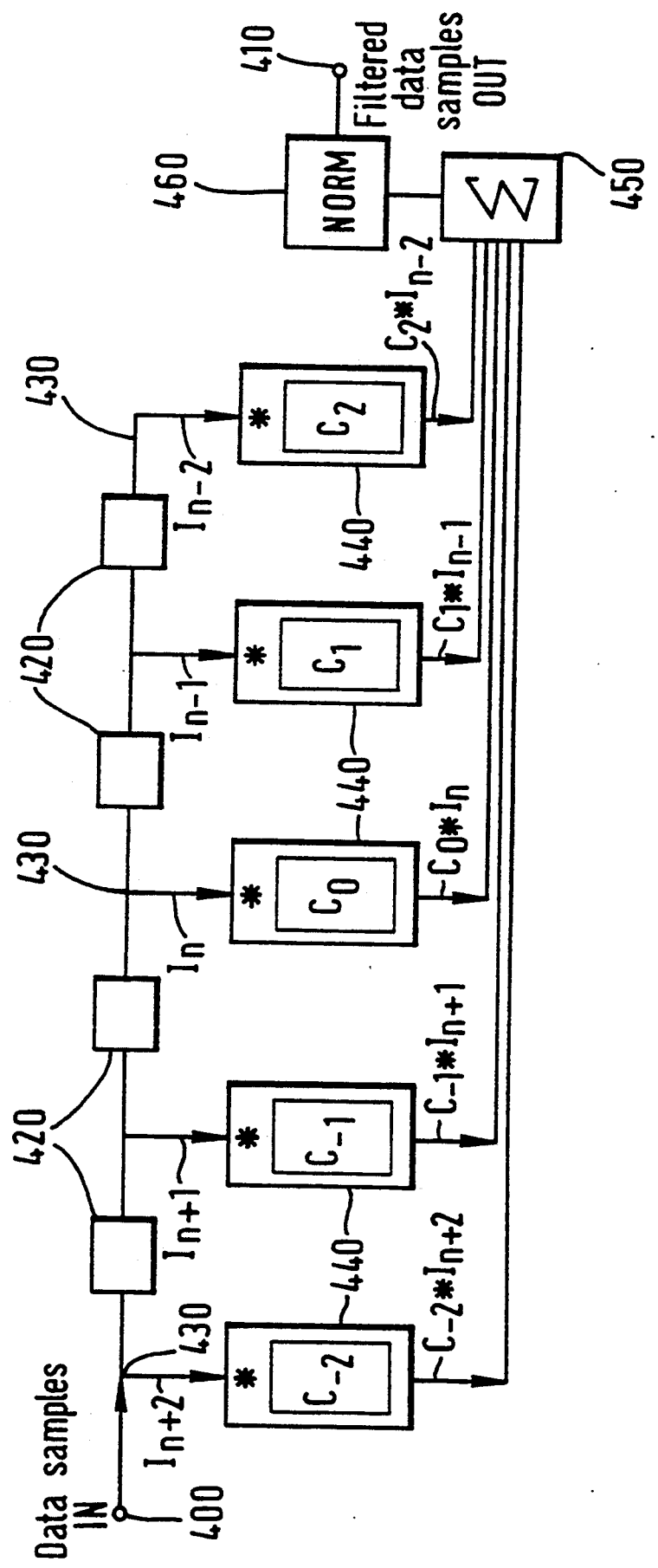
FIG. 5 is a schematic illustration of a finite impulse response (FIR) digital filter.

FIG. 5 is a schematic illustration of a finite impulse response (FIR) digital filter. Successive samples of data to be filtered are applied to an input terminal 400, with filtered output data being supplied at an output terminal 410. The input samples progress along a tapped delay line comprising a number of delay elements 420. The delay period imposed by each of the delay elements 420 is set as appropriate. For example, if filtering is being performed in the horizontal (line scanning) direction, the delay imposed by the delay elements 420 is equal to an integral number of sample periods in the horizontal direction. If vertical filtering is being performed the delay imposed by the delay elements 420 is equal to an integral number of line periods so that at any one time the respective data samples at the outputs of the delay elements 420 represent vertically adjacent pixels at corresponding positions on adjacent scanning lines.

The delay line is tapped at either side of each delay element 420 by respective taps 430. The data value at each tap is fed to a multiplier 440. The multipliers 440 generate an output representing the product of the data sample at that tap and a coefficient $C_i$ corresponding to the position along the delay line of that tap. The outputs from the multipliers 440 are fed to an adder 450 where their sum is calculated. The sum generated by the adder 450 is then fed to a normaliser 460. Normalisation is performed in order that the gain of the filter as a whole can be set. Generally each filter will be normalised to have a gain of unity by dividing the sum generated by the adder 450 by the sum of the coefficients $C_i$. However, if a number of filtering operations are being performed serially the gain of the first filter may be set to a higher value, such as 16, to allow the intermediate filtering operations to be performed at a higher precision than that of the input data. To reduce the precision of the final output data to that of the input data the final filter in the chain would be normalised to have a gain of 1/16.

In FIG. 5, successive input data samples are represented by $I_0 \ldots I_{n-2} \ldots I_{n+2} \ldots$ The data samples present at the five taps 430 are multiplied by respective ones of the coefficients $C_{-2}$ to $C_2$. The products of these multiplications (for example $I_{n-1}*C_1$) are shown next to the respective signal line carrying that product value.

The output of the adder 450 can be represented in the above notation as:

$$\sum_{-2}^{2} C_i * I_{n-i}$$

and the output when normalised to unity gain as:

$$\sum_{-2}^{2} C_i * I_{n-i} / \sum_{-2}^{2} C_i .$$

It would be possible to employ separate high and low pass filters in conjunction with a sub-sampling arrangement to provide decimation. Similarly interpolation could be achieved by inserting zeroes into alternate sample positions in the HF and LF data streams, filtering each data stream separately, and then summing. However, in the present embodiment single switchable filters are used for decimation and interpolation. These filters will be described below with reference to FIGS. 6 and 7.

Figure 6:
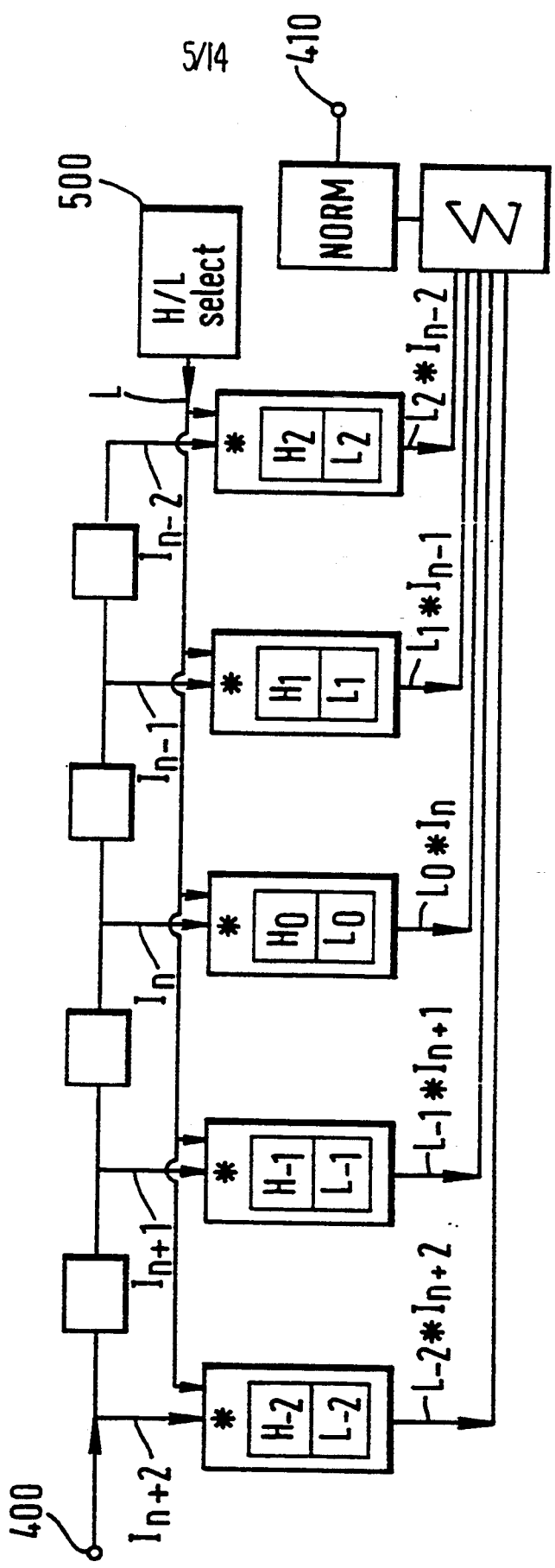
FIG. 6 shows an FIR filter for use as a decimation filter.

FIG. 6 shows a finite impulse response filter for use as a first stage low and high pass decimation filter. The filter shown in FIG. 6 is similar to the basic FIR filter shown in FIG. 5, with the addition of a decimation coefficient selector 500 for switching the filter between two sets of filter coefficients, namely $H_{-2} \ldots H_2$ and $L_{-2} \ldots L_2$ for high pass (HF) and low pass (LF) filtering respectively.

Successive data samples are applied to the input terminal 400 and progress along the tapped delay line as described above. The decimation coefficient selector 500 switches the filter between the two sets of coefficients so that the output filtered samples alternate between high and low pass filtered samples. In this way the sample rates of the low pass filtered samples and of the high pass filtered samples each amount to one-half of the sample rate originally applied to the input terminal 400. Filtering and decimation (sub-sampling) have therefore been achieved in a single operation.

In FIG. 6 the coefficient selector 500 is shown as having selected the set of LF filter coefficients. The output data sample is therefore one of the low pass filtered samples. The decimation coefficient selector 500 will then change over to select the set of HF filter coefficients, so the next output sample will be one of the high pass filtered samples.

As described above, the samples at the output terminal 410 of the filter shown in FIG. 6 represent a multiplexed data stream in which alternate samples are high pass and low pass filtered samples. It would be possible to de-multiplex this data stream to separate the high pass and low pass filtered samples, but when the filter is part of a larger filter arrangement it is preferable to design any subsequent filters within the filter arrangement to process the data directly when multiplexed in this manner.

Figure 7:
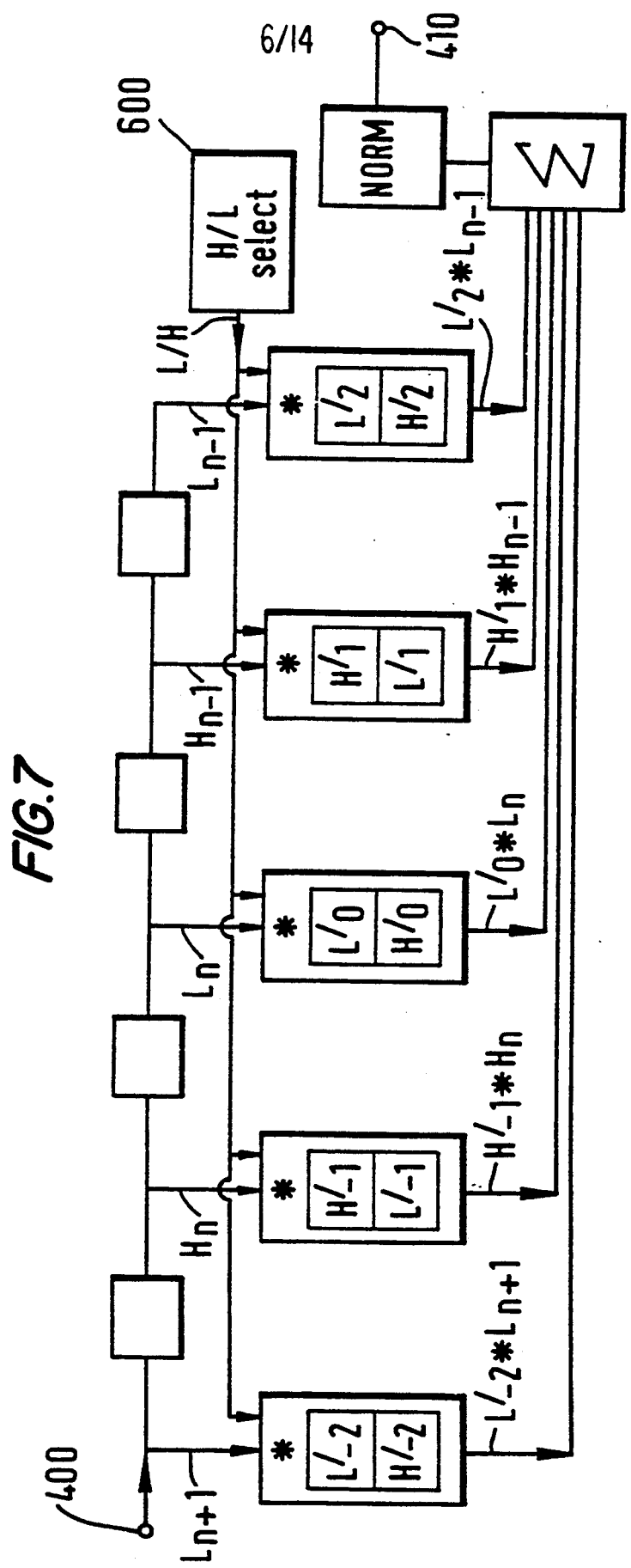
FIG. 7 shows an FIR filter for use as an interpolation filter.

FIG. 7 shows a finite impulse response filter fop use as a final stage, low pass and high pass, interpolation filter. In this respect the filter shown in FIG. 7 is complementary to the one shown in FIG. 6 above.

The data samples at the input to the filter in FIG. 7 alternate between high pass ($H_n$) and low pass ($L_n$) filtered samples. The function of the interpolation filter is to combine these two multiplexed streams of data samples into a single data stream at twice the sample rate of either one of the two input data streams.

An interpolation coefficient selector 600 is used which is similar to the decimation coefficient selector 500 described above, in that it switches the filter between two sets of filter coefficients for alternate output samples. In this case, however, one of the sets comprises odd LF and even HF coefficients $H_{-2}, L_{-1}, H_0, L_1, H_2$, and the other set comprises odd HF and even LF coefficients $L_{-2}, H_{-1}, L_0, H_1, L_2$. Each alternate sample progressing through the delay line is multiplied by an LF or HF coefficient as appropriate. As the samples progress from one tap to the next the coefficient selector switches the set of coefficients used so that a LF sample is always multiplied by a LF coefficient, and a HF sample is always multiplied by a HF coefficient. The output of the filter is a single stream of interpolated samples at twice the sample rate of either the LF or the HF filtered samples presented at the input terminal 400.

FIGS. 8 to 11 show the coefficients and corresponding frequency responses, for four examples of different length decimation/interpolation filter pairs for use in a sub-band decorrelator, namely:

a long filter pair (FIG. 8);
a medium length filter pair (FIG. 9);
a first short filter pair (FIG. 10); and
a second short filter pair (FIG. 11).

It should be noted that the illustrated filters are all odd symmetric and that therefore only the middle and right hand coefficients are shown. In other words the full set of coefficients for the second short filter pair shown in FIG. 11 are as follows:

| | |
|---|---|
| −1, 4, 10, 4, −1 | (Decimation); and |
| −1, −4, 25, 56, 25, −4, −1 | (Interpolation). |

For each of the decimation and interpolation filters shown in FIGS. 8 to 11 the corresponding frequency response is illustrated. In each case the horizontal axis represents frequency from zero on the left to the Nyquist frequency (one-half of the sampling frequency) on the right. The dotted vertical line in the centre of each graph represents the half-Nyquist frequency. The vertical axis represents the response of the filter plotted on a linear scale. The filter coefficients for each of the filters are listed to the left of the vertical axis, with the coefficient corresponding to the centre tap at the top of the list.

It will be recalled that in the sub-band coding system shown in FIG. 2, the decimation filters were used in the process of splitting an input sample signal into upper and lower frequency ranges, and the interpolation filters were used in the reconstruction process when upper and lower frequency ranges are combined to form a single sampled signal. For these purposes a very sharp frequency cut off at the half-Nyquist frequency is desirable to avoid unwanted alias distortion in which frequency components from outside the range represented by a sub-band are included in that sub-band because of a non zero response of the filter at those frequencies. It will be evident from the graphs shown in FIGS. 8 to 11 that increasing the number of taps in the decimation and interpolation filters provides a sharper cut-off at the half-Nyquist frequency.

Figure 12:
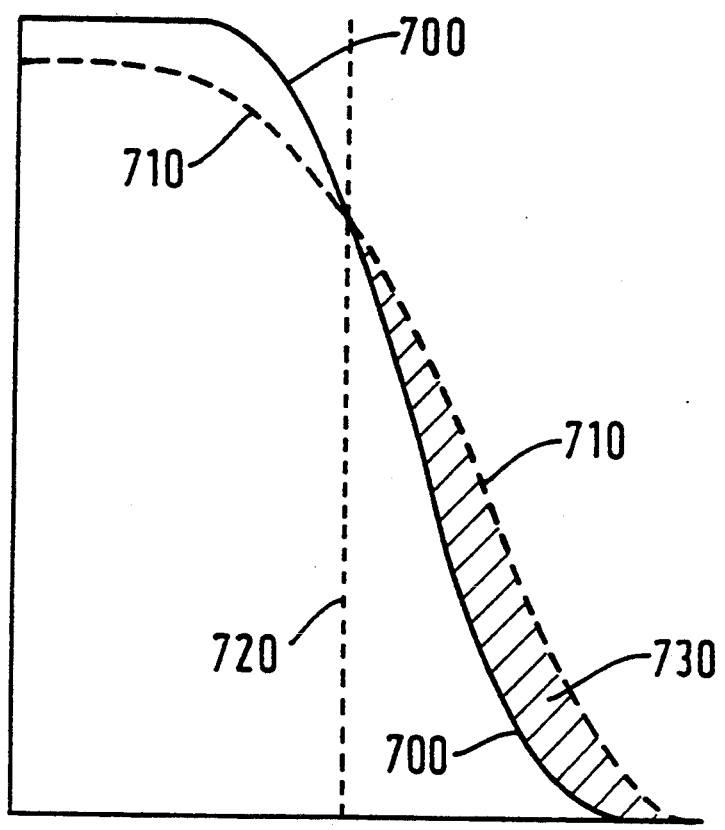
FIG. 12 illustrates alias distortion introduced by the decimation filters.

FIG. 12 illustrates the different degrees of alias distortion introduced by filters of different tap lengths. In FIG. 12 two of the frequency response curves described above are superimposed. In particular, the curve for the medium length decimation filter shown in FIG. 9 is shown by a solid line 700, and the curve for the second short length decimation filter shown in FIG. 11 is shown by a dashed line 710. As before, the horizontal axis represents frequency, with a dotted vertical line 720 denoting the half-Nyquist frequency, and the vertical axis represents the filter response plotted on a linear scale.

When the decimation filters shown in FIG. 12 are used for decimation filtering, a certain amount of alias distortion will be introduced. This distortion arises because the filters do not have a perfect cut-off at the half-Nyquist frequency, and so cannot be used to divide the frequency range into two entirely distinct parts. Instead, there will be some overlap of undesired frequencies into a particular frequency sub-band. For example, if the filters shown in FIG. 12 are used for low-pass (LF) decimation filtering, then ideally they would have a flat response up to the half-Nyquist frequency and a zero response above that frequency. It will be seen from FIG. 12 that neither filter provides this ideal response, in that each of the two filters shown allows some frequencies above the half-Nyquist level to pass, giving rise to alias distortions. However, the medium length filter provides a sharper cut-off than the short length filter and so excludes more of the unwanted frequencies. The high frequency components allowed to pass by the short filter but excluded by the medium length filter are illustrated schematically in FIG. 12 as a shaded portion 730.

Figure 13A:
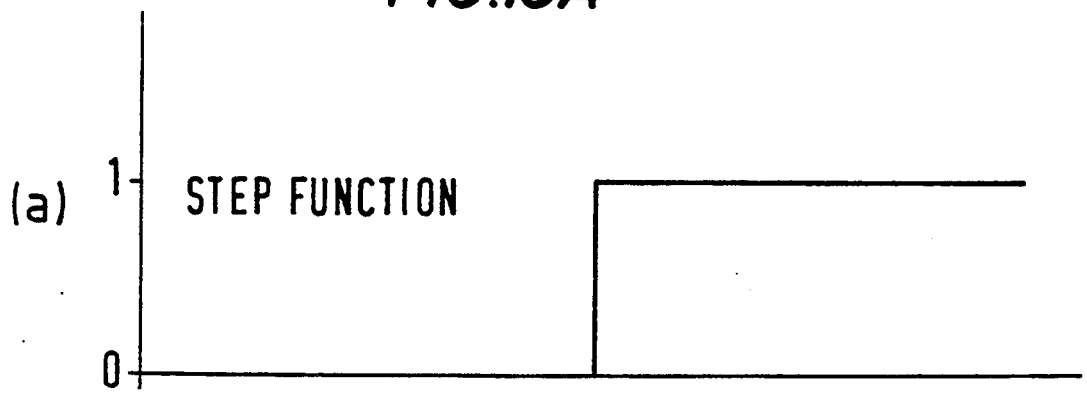
FIGS. 13(a) to 13(c) illustrate ringing introduced by the interpolation filters.
Figure 13B:
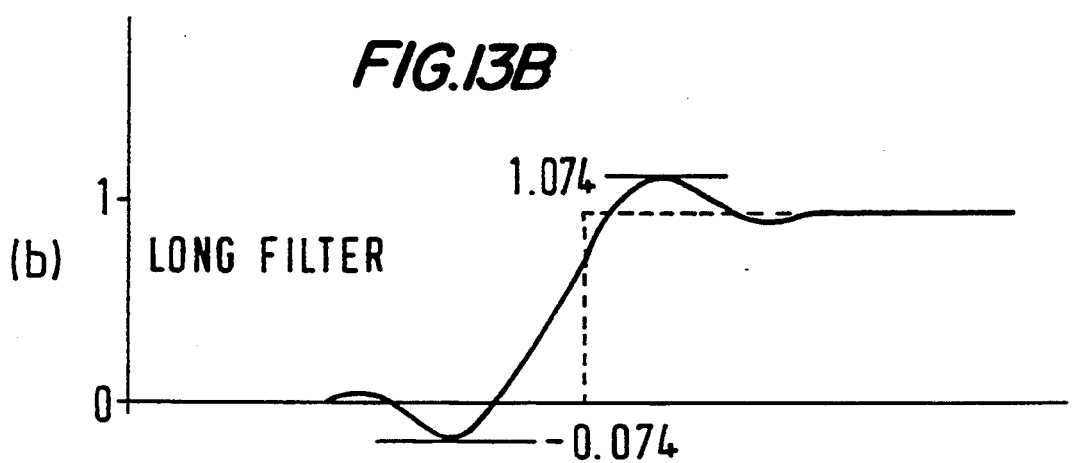
Figure 13C:
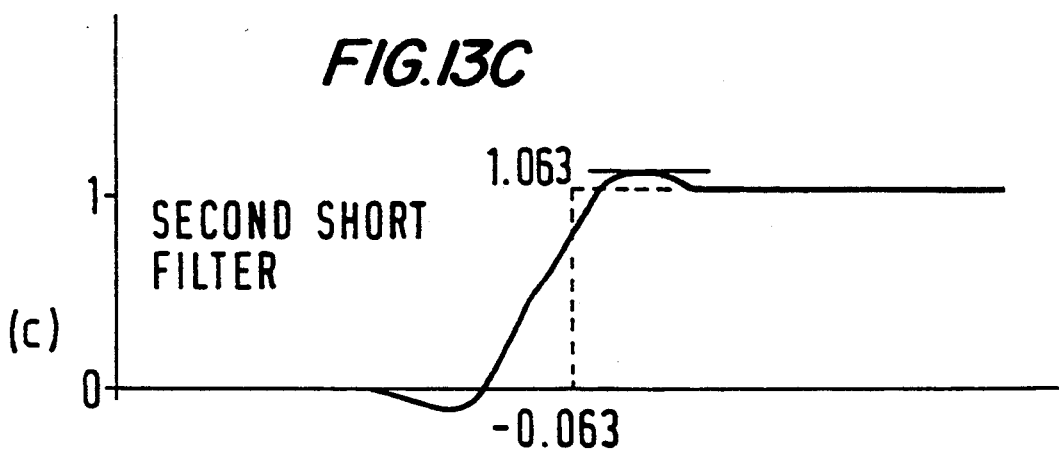

FIGS. 13(a) to 13(c) schematically illustrate the response of two of the filters shown in FIGS. 8 to 11 to a unit step function. A step function has been used to represent a broad class of data errors which may be encountered when recorded or transmitted image data is received or replayed. The step function is shown graphically in FIG. 13(a) and in broken line on FIGS. 13(b) and 13(c). The two responses shown in FIGS. 13(b) and 13(c) have been exaggerated by equal amounts in order that the different amounts of ringing introduced by the respective filters may be seen clearly.

Figure 8B:
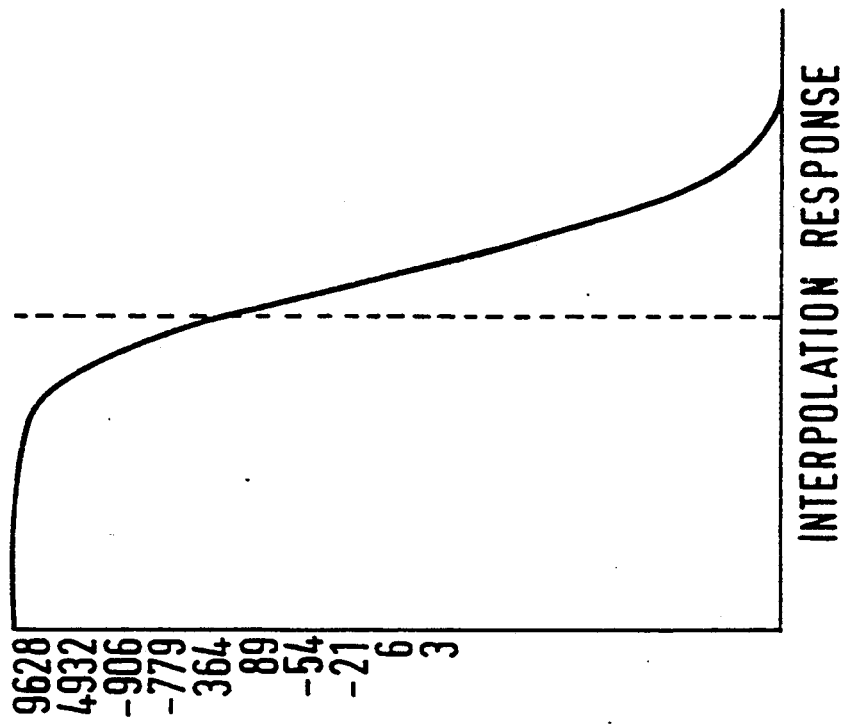
Figure 8A:
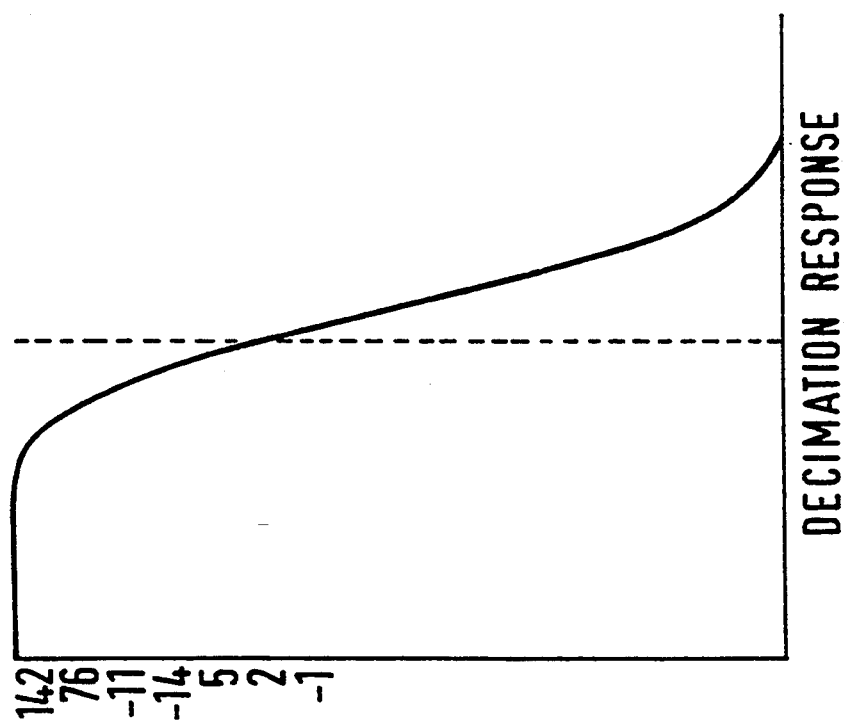
Figure 10B:
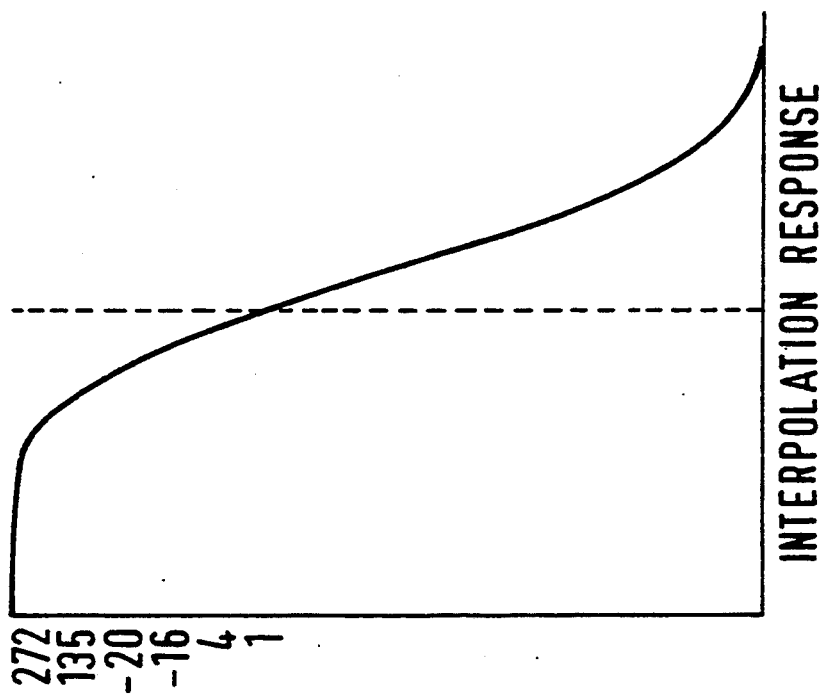
Figure 10A:
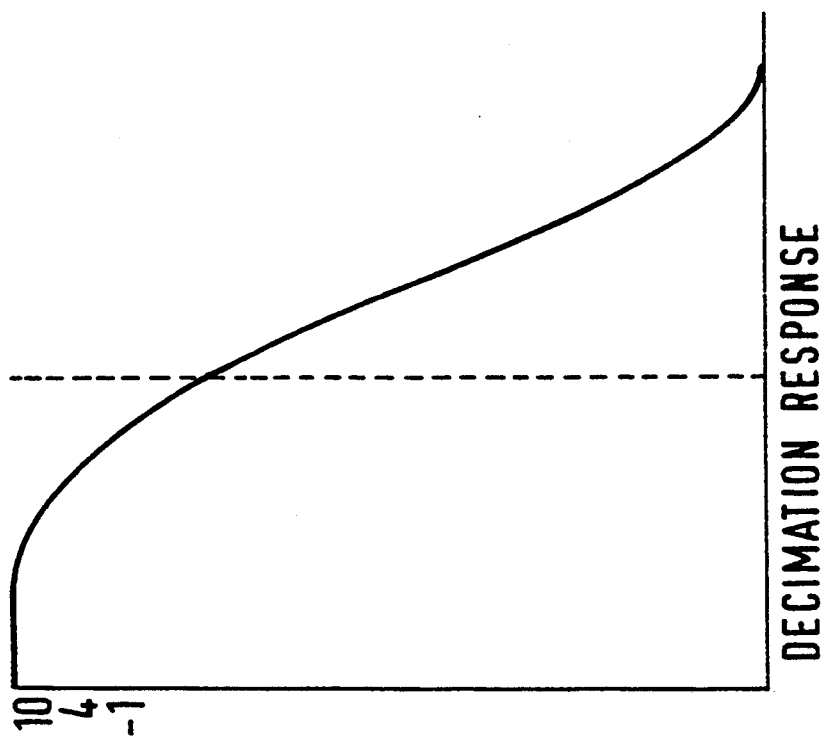

FIG. 13(b) shows the response of the long (13 tap) decimation filter shown in FIG. 8, and FIG. 13(c) shows the response of the second short length (5 tap) decimation filter shown in FIG. 11. The two graphs demonstrate that the filters introduce ringing at either side of the original step function. However, the ringing introduced by the five-tap filter in FIG. 13(c) is neither as extensive in time (across the page) nor as extreme in amplitude as that introduced by the thirteen tap filter shown in FIG. 13(b). It will therefore be seen that a shorter filter length has the advantage of reduced ringing in the filtered data. It has the further advantage of offering a simpler hardware implementation. However, as described above, a shorter filter length can give rise to greater alias distortion in the filtering process.

In the present embodiment it has been recognised that different filter characteristics may be appropriate for use in horizontal and vertical filtering of a sampled image. In the horizontal direction it is usual to apply an anti-alias filter to an image before digitising the image. Horizontal image data does not therefore suffer from significant alias distortion. However, the same may not be true in the vertical direction. In interlaced video data, each field comprises only alternate lines of image data, that is, every other sample in the vertical direction. The image has therefore been sub-sampled in the vertical direction. This sub-sampling is generally performed without any anti-aliasing filtering, so it is usual that the image data will suffer from severe vertical aliasing. Furthermore, when the image is reconstructed, any ringing will be particularly noticeable in the vertical direction because the filtered samples are spaced twice as far apart in the image as samples in the horizontal direction.

It is possible to meet the different requirements of filtering the image data in the horizontal and vertical directions by performing the vertical filtering with shorter tap-length filters than those used for the horizontal filtering. The effect of this is that the visibility of vertical ringing is reduced, at the expense of increased vertical aliasing. However, since the image is already heavily aliased in the vertical direction, the use of a short tap-length filter for vertical filtering may introduce only a tolerably small additional alias distortion in the vertical direction.

In the present embodiment the different requirements of the luminance and chrominance components of the image have been recognised, so the sub-band filtering is performed by separate luminance and chrominance horizontal and vertical filter arrangements. Two preferred configurations of the example filters described above with reference to FIGS. 8 to 11 are as follows:

|  | Horizontal Luminance | Vertical Luminance | Horizontal Chrominance | Vertical Chrominance |
| --- | --- | --- | --- | --- |
| Config. 1 | Medium | First Short | First Short | Second Short |
| Config. 2 | Long | Medium | Second Short | Second Short |

These configurations assume that a single type of filter is used throughout each of the filter arrangements (for example the horizontal luminance filter arrangement). However, FIG. 14 illustrates a configuration of the sub-band coding system in which filters having different tap lengths are used for different stages of decimation and interpolation. FIG. 14(a) shows a horizontal luminance filter arrangement 300 and FIG. 14(b) shows a vertical luminance arrangement 330. Each filter arrangement includes a number of stages of filtering for decimation and for interpolation. The arrangements are symmetrical in that each stage of decimation corresponds to a complementary stage of interpolation.

For each of the filter stages a respective filter type has been selected from those shown in FIGS. 8 to 11. For example, in the first stage of filtering in the horizontal direction a long decimation filter is used. Similarly in the final stage of interpolation in the horizontal luminance filter arrangement the corresponding long interpolation filter is used. In the second stage of decimation and interpolation filtering in the horizontal direction a medium length filter pair has been used. The selection of filter type is therefore symmetrical in that for each stage of decimation filtering the corresponding stage of interpolation uses a filter which is complementary to the decimation filter.

The use of different filter lengths for the different stages of decimation and interpolation, and in particular the use of shorter filters for later decimation and earlier interpolation stages, allows the filter length to be matched to the resolution of the image to be filtered. For example, at the second stage of decimation the image data has already been filtered into two halves, each of which has been sub-sampled to one-half of the original sample rate. Adjacent samples in this filtered data therefore relate to picture areas twice as far apart as adjacent samples in the unfiltered data. It is therefore beneficial to use a shorter filter length at this stage of decimation and interpolation to reduce any ringing distortion in the reconstructed image. Similarly, at the third stage of decimation adjacent samples relate to picture areas four times further apart than adjacent samples in the unfiltered data, so an even shorter filter length is justified.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Image processing apparatus for filtering a digital representation of a raster scanned image into a plurality of sub-bands in the two-dimensional spatial frequency domain, said raster scanned image having a resolution in a first direction and a resolution in a second direction, said raster scanned image corresponding to a reconstructed image having a resolution in the first direction and a resolution in the second direction and having aliasing distortion and ringing distortion, the aliasing distortion in said second direction being greater than in said first direction, said resolution of said raster scanned image in said first direction being greater than said resolution of said raster scanned image in said second direction such that a portion of the ringing distortion in said first direction is confined to a smaller region of said reconstructed image than a portion of the ringing distortion of equal magnitude in said second direction of said reconstructed image, said image processing apparatus comprising:

decimation filter means having a first forward filter group comprising a first plurality of multi-tap digital decimation filters, each having a filter length, for filtering in said first direction and a second forward filter group comprising a second plurality of multi-tap digital decimation filters, each having a filter length, for filtering in said second direction, said filter lengths of said first plurality of multi-tap digital decimation filters having a mean which is greater than the mean of said filter lengths of said second plurality of multi-tap digital decimation filters such that the aliasing distortion is reduced in said first direction and the ringing distortion is reduced in said second direction without significantly increasing the aliasing distortion in said second direction.

2. Image processing apparatus as claimed in claim 1, in which:

at least one of said first forward filter group and second forward filter group comprises a first and a second filter stage, said first filter stage being operable to generate a decimated output, said decimated output of said first filter stage being supplied to said second filter stage, said first filter stage having a greater resolution than said filter second stage, each of said first filter stage and said second filter stage comprising at least one of said first plurality and at least one of said second plurality of multi-tap digital decimation filters, said filter length of said filters in said first filter stage being greater than said filter length of said filters in said second filter stage such that the ringing distortion of said reconstructed image is further reduced as a function of the respective resolutions of said first filter stage and said second filter stage.

3. Image processing apparatus as claimed in claim 1, in which:

all of said filters in said first plurality of multi-tap digital decimation filters have the same filter length; and all of said filters in said second plurality of multi-tap digital decimation filters have the same filter length.

4. Image processing apparatus as claimed in claim 1, in which:

said first direction is substantially a direction of line scanning of said raster scanned image; and said second direction is substantially perpendicular to said first direction.

5. Image processing apparatus as claimed in claim 1, wherein said raster scanned image comprises a luminance component and a chrominance component, and wherein said decimation filter means includes first and second decimation filter means for respective filtering of said luminance and chrominance components of said raster scanned image, each of said first and second decimation filter means having a respective first forward filter group comprising a first plurality of multi-tap digital decimation filters, each having a filter length, for filtering in said first direction and respective second forward filter group comprising a second plurality of multi-tap digital decimation filters, each having a filter length, for filtering in said second direction.

6. Image processing apparatus as claimed in claim 5, wherein a mean of said filter lengths of said first plurality of multi-tap digital decimation filters in said first decimation filter means is greater than a mean of said filter lengths of said first plurality of multi-tap digital decimation filters in said second decimation filter means such that the aliasing distortion and the ringing distortion of said luminance component and the aliasing distortion and the ringing distortion of said chrominance component are respectively reduced.

7. Image processing apparatus as claimed in claim 5, wherein a mean of said filter lengths of said second plurality of multi-tap digital decimation filters in said first decimation filter means is greater than a mean of said filter lengths of said second plurality of multi-tap digital decimation filters in said second decimation filter means such that the aliasing distortion and the ringing distortion of said luminance component and the aliasing distortion and the ringing distortion of said chrominance component are respectively reduced.

8. Image processing apparatus as claimed in claim 5, in which, in said first decimation filter means:

at least one of said first plurality of multi-tap digital decimation filters has relative filter coefficients of −1, 2, 5, −14, −11, 76, 142, 76, −11, −14, 5, 2, −1; and at least one of said second plurality of multi-tap digital decimation filters has relative filter coefficients of 1, −2, −4, 18, 38, 18, −4, −2, 1.

9. Image processing apparatus as claimed in claim 5, in which, in said first decimation filter means:

at least one of said first plurality of multi-tap digital decimation filters has relative filter coefficients of 1, −2, −4, 18, 38, 18, −4, −2, 1; and at least one of said second plurality of multi-tap digital decimation filters has relative filter coefficients of −1, 4, 10, 4, −1.

10. Image processing apparatus as claimed in claim 5, in which, in said second decimation filter means:

at least one of said first plurality of multi-tap digital decimation filters has relative filter coefficients of −1, 4, 10, 4, −1; and at least one of said second plurality of multi-tap digital decimation filters has relative filter coefficients of −1, 4, 10, 4, −1.

11. Image processing apparatus as claimed in claim 1, further comprising interpolation filter means for reconstructing said reconstructed image from said plurality of sub-bands, said interpolation filter means having first reverse filter group comprising a first plurality of multi-tap digital interpolation filters, complementary to said first plurality of multi-tap digital decimation filters of said first forward filter group and each having a filter length, for filtering in said first direction and second reverse filter group comprising a second plurality of multi-tap digital interpolation filters, complementary to said second plurality of multi-tap digital decimation filters of said second forward filter group and each having a filter length, for filtering in said second direction, said filter lengths of said first plurality of multi-tap digital interpolation filters of said first reverse filter group having a mean which is greater than the mean of said filter lengths of said second plurality of multi-tap digital interpolation filters of said second reverse filter group such that the aliasing distortion is reduced in said first direction and the ringing distortion is reduced in said second direction without significantly increasing the aliasing distortion in said second direction.

12. Image processing apparatus in which a reconstructed digital representation of a raster scanned image is interpolated from a plurality of sub-bands in the two-dimensional spatial frequency domain and having aliasing distortion and ringing distortion, the aliasing distortion in said second direction being greater than in said first direction, said raster scanned image having a resolution in a first direction and a resolution in a second direction, said resolution of said raster scanned image in said first direction being greater than said resolution of said raster scanned image in said second direction such that a portion of the ringing distortion in said first direction is confined to a smaller region of said reconstructed image than a portion of the ringing distortion of equal magnitude in said second direction of said reconstructed image, said image processing apparatus comprising:

interpolation filter means having a first filter group comprising a first plurality of multi-tap digital interpolation filters, each having a filter length, for filtering in said first direction and a second filter group comprising a second plurality of multi-tap digital interpolation filters, each having a filter length, for filtering in said second direction, said filter lengths of said first plurality of multi-tap digital interpolation filters having a mean which is greater than the mean of said filter lengths of said second plurality of multi-tap digital interpolation filters such that the aliasing distortion is reduced in said first direction and the ringing distortion is reduced in said second direction without significantly increasing the aliasing distortion in said second direction.

13. Image processing apparatus as claimed in claim 12, in which:

at least one of said first filter group and second filter group comprises a first and a second filter stage, said first filter stage being operable to generate an interpolated output, said interpolated output of said first filter stage being supplied to said second filter stage, said first filter stage having a greater resolution than said second filter stage, each of said first filter stage and said second filter stage comprising at least one of said first plurality and at least one of said second plurality of multi-tap digital interpolation filters, said filter length of said filters in said second stage being greater than said filter length of said filters in said first stage such that the ringing distortion of said reconstructed image is further reduced as a function of the respective resolutions of said first filter stage and said second filter stage.

14. Image processing apparatus as claimed in claim 12, in which:

all of said filters in said first plurality of multi-tap digital interpolation filters have the same filter length; and all of said filters in said second plurality of multi-tap digital interpolation filters have the same filter length.

15. Image processing apparatus as claimed in claim 12, in which:

said first direction is substantially a direction of line scanning of said raster scanned image; and said second direction is substantially perpendicular to said first direction.

16. Image processing apparatus as claimed in claim 12, wherein said reconstructed digital representation of a raster scanned image comprises a luminance component and a chrominance component, and wherein said interpolation filter means includes first interpolation filter means and second interpolation filter means for respective filtering of said luminance and chrominance components of said raster scanned image, each of said first and said second interpolation filter means having respective a first filter group comprising a first plurality of multi-tap digital interpolation filters, each having a filter length, for filtering in said first direction and a respective second filter group comprising a second plurality of multi-tap digital interpolation filters, each having a filter length, for filtering in said second direction.

17. Image processing apparatus as claimed in claim 16, wherein a mean of said filter lengths of said first plurality of multi-tap digital interpolation filters in said first interpolation filter means if greater than a mean of said filter lengths of said first plurality of multi-tap digital interpolation filters in said second interpolation filter means such that the aliasing distortion and the ringing distortion of said luminance component and the aliasing distortion and the ringing distortion of said chrominance component are respectively reduced.

18. Image processing apparatus as claimed in claim 16, wherein a mean of said filter lengths of said second plurality of multi-tap digital interpolation filters in said first interpolation filter means is greater than a mean of said filter lengths of said second plurality of multi-tap digital interpolation filters in said second interpolation filter means such that the aliasing distortion and the ringing distortion of said luminance component and the aliasing distortion and the ringing distortion of said chrominance component are respectively reduced.

19. Image processing apparatus as claimed in claim 16, in which, in said first interpolation filter means:
   at least one of said first plurality of multi-tap digital interpolation filters has relative filter coefficients of 3, 6, −21, −54, 89, 364, −779, −906, 4932, 9628, 4932, −906, −779, 364, 89, −54, −21, 6, 3; and
   at least one of said second plurality of multi-tap digital interpolation filters has relative filter coefficients of −2, −4, 13, 46, −139, −140, 992, 1924, 992, −140, −139, 46, 13, −4, −2.

20. Image processing apparatus as claimed in any one of claim 16, in which, in said first interpolation filter means:
   at least one of said first plurality of multi-tap digital interpolation filters has relative filter coefficients of −2, −4, 13, 46, −139, −140, 992, 1924, 992, −140, −139, 46, 13, −4, −2; and
   at least one of said second plurality of multi-tap digital interpolation filters has relative filter coefficients of 1, 4, −16, −20, 135, 272, 135, −20, −16, 4, 1.

21. Image processing apparatus as claimed in claim 16, in which, in said second interpolation filter means:
   at least one of said first plurality of multi-tap digital interpolation filters has relative filter coefficients of 1, 4, −16, −20, 135, 272, 135, 20, 16, 4, 1; and
   at least one of said second plurality of multi-tap digital interpolation filters has relative filter coefficients of −1, −4, 25, 56, 25, 4, 1.

22. Image processing apparatus as claimed in claim 16, in which, in said second interpolation filter means:
   at least one of said first plurality of multi-tap digital interpolation filters has relative filter coefficients of −1, 4, 25, 56, 25, −4, −1; and
   at least one of said second plurality of multi-tap digital interpolation filters has relative filter coefficients of −1, −4, 25, 56, 25, −4, −1.

23. Image data compression apparatus comprising image processing apparatus as claimed in claim 1.

24. Image data decompression apparatus comprising image processing apparatus as claimed in claim 11.

25. Image data storage apparatus comprising image processing apparatus as claimed in claim 1.

26. A method of filtering a digital representation of a raster scanned image into a plurality of sub-bands in the two-dimensional spatial frequency domain, said raster scanned image having a resolution in a first direction and a resolution in a second direction, said raster scanned image corresponding to a reconstructed image having a resolution in the first direction and a resolution in the second direction and having aliasing distortion and ringing distortion, the aliasing distortion in said second direction being greater than in said first direction, said resolution of said raster scanned image in said first direction being greater than said resolution of said raster scanned image in said second direction such that a portion of the ringing distortion in said first direction is confined to a smaller region of said reconstructed image than a portion of the ringing distortion of equal magnitude in said second direction of said reconstructed image, said method comprising the steps of:
   (I) filtering in said first direction with a first plurality of multi-tap digital decimation filters, each having a filter length; and
   (II) filtering in said second direction with a second plurality of multi-tap digital decimation filters, each having a filter length, said filter lengths of said first plurality of multi-tap digital decimation filters having a mean which is greater than the mean of the filter lengths of said second plurality of multi-tap digital decimation filters such that the aliasing distortion is reduced in said first direction and the ringing distortion is reduced in said second direction without significantly increasing the aliasing distortion in said second direction.

27. A method of interpolating a reconstructed digital representation of a raster scanned image from a plurality of sub-bands in the two-dimensional spatial frequency domain and having aliasing distortion and ringing distortion, the aliasing distortion in said second direction being greater than in said first direction, said raster scanned image having a resolution in a first direction and a resolution in a second direction, said resolution of said raster scanned image in said first direction being greater than said resolution of the raster scanned image in said second direction such that a portion of the ringing distortion in said first direction is confined to a smaller region of said reconstructed image than a portion of the ringing distortion of equal magnitude in said second direction of said reconstructed image, said method comprising the steps of:
   (I) filtering in said first direction with a first plurality of multi-tap digital interpolation filters, each having a filter length; and
   (II) filtering in said second direction with a second plurality of multi-tap digital interpolation filters, each having a filter length, said filter lengths of said first plurality of multi-tap digital interpolation filter having a mean which is greater than the mean of said filter lengths of said second plurality of multi-tap digital interpolation filters such that the aliasing distortion is reduced in said first direction and the ringing distortion is reduced in said second direction without significantly increasing the aliasing distortion in said second direction.

* * * * *